United States Patent [19]

Burba et al.

[11] Patent Number: 5,176,942

[45] Date of Patent: Jan. 5, 1993

[54] PROCESS FOR MANUFACTURING FIBER-REINFORCED BASE MATERIALS FOR THE ELECTRICAL INDUSTRY BASED ON EPOXY RESIN AND IMIDAZOLE-ACRYLIC ACID ADDUCT CURING AGENTS

[75] Inventors: Christian Burba, Herbern; Werner Mrotzek, Dortmund, both of Fed. Rep. of Germany

[73] Assignee: Schering AG, Bergkamen, Fed. Rep. of Germany

[21] Appl. No.: 533,112

[22] Filed: Jun. 4, 1990

[30] Foreign Application Priority Data

Jun. 24, 1989 [DE] Fed. Rep. of Germany ....... 3920725

[51] Int. Cl.$^5$ ............................................... B05D 3/02
[52] U.S. Cl. ............................... 427/379; 427/386; 528/94; 528/111; 528/117; 525/502; 525/504
[58] Field of Search ........................ 528/94, 111, 117; 427/379, 386; 525/502, 504

[56] References Cited

U.S. PATENT DOCUMENTS

| | | | |
|---|---|---|---|
| 3,329,652 | 7/1967 | Christie | 528/94 |
| 3,394,105 | 7/1968 | Christie | 528/94 |
| 3,677,978 | 6/1972 | Dowbenko et al. | 528/94 |
| 4,968,767 | 11/1990 | Burba et al. | 528/94 |

FOREIGN PATENT DOCUMENTS 0024119 2/1981 European Pat. Off. .
0211978 3/1987 European Pat. Off. .

OTHER PUBLICATIONS

Chemical Abstracts, vol. 83, No. 16, 20 Oct. 1975, (Columbus, Ohio), abstract 132631e.
WPI File Supplier, An=74-33768v, Derwent Publications Ltd.
WPI File Supplier, An=73-01100v, Derwent Publications Ltd.
International Search Report.

*Primary Examiner*—John C. Bleutge
*Assistant Examiner*—Frederick Krass
*Attorney, Agent, or Firm*—Curtis, Morris & Safford

[57] ABSTRACT

The invention relates to a process for manufacturing fiber-reinforced boards for the electrical industry by the use of epoxy resins and latent curing agents based on imidazole/acrylic acid reaction products based on the general formula

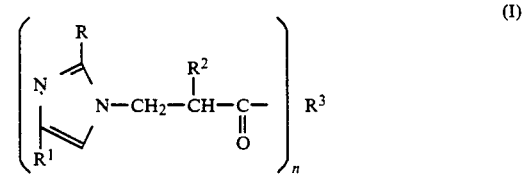

(I)

wherein R, $R^1$ and $R^2$ are, independently of one another, H or a short-chain alkyl group having from 1 to 3 carbon atoms, $R^3$ is a group of the formula

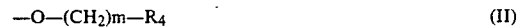

(II)

wherein m is an integer between 2 and 6, $R^4$ is H, —OH or —O—, and n is equal to the valence of $R^3$.

7 Claims, No Drawings

PROCESS FOR MANUFACTURING FIBER-REINFORCED BASE MATERIALS FOR THE ELECTRICAL INDUSTRY BASED ON EPOXY RESIN AND IMIDAZOLE-ACRYLIC ACID ADDUCT CURING AGENTS

The invention relates to a process for manufacturing fiber-reinforced boards for the electrical industry by the use of epoxy resins and latent curing agents based on imidazole/acrylic acid reaction products.

In modern technology, components known as printed circuit boards (PCB's) have been used for some time which use electric circuits in the form of vapor-deposited conductors in place of wiring.

With this technique, thin, electrically conductive layers are applied to insulating base materials by various methods. The homogeneity of the base material has to meet stringent requirements, which become steadily more rigorous as miniaturization advances. Any inhomogeneity of the order of magnitude of the geometric dimensions of the conductors (width and thickness) can lead to serious malfunctions.

The base materials which today are used predominantly are fiber-reinforced materials in which curable mixtures of epoxy resins and amine curing agents are used as binders.

From the reinforcing materials and the binder, so-called prepregs are first produced, and these can be stored before they are cured under pressure and at elevated temperatures.

In the prepregs, the binder is in the so-called B stage, that is, it is partially cured. Consequently it is solid but still largely soluble in solvents and also fusible.

To achieve this stage, the curing agent should meet specific requirements:

It should be possible to reach the B stage at a minimum expenditure of energy (temperature and time), yet permit that stage to be maintained for a long period of time after cooling to room temperature.

Complete cure, on the other hand, should be achievable within a short time at the lowest possible temperatures and with-out pronounced exothermicity.

The finished products should, of course, meet the physical and mechanical end-use requirements.

Epoxy resins cured with dicyandiamide substantially satisfy these requirements so far as their physical and mechanical properties and also their storage and curing behavior are concerned, and dicyandiamide is therefore predominantly used at present, occasionally together with accelerators.

The advantageous storage and curing behavior is due to the fact that at room temperature dicyandiamide is substantially insoluble in the usual epoxy resins.

When solid crystalline dicyandiamide is used, inhomogeneities are observed in the cured substrates which are due to undissolved and unreacted particles.

While homogeneous substrates can be produced when dicyandiamide solutions are employed, the use of solvents gives rise to other problems.

Dicyandiamide is soluble in sufficient amounts only in a few solvents, particularly dimethylformamide or methyl glycol. However, these solvents are toxicologically hazardous and cause problems not only in the manufacture of the prepregs, that is, during the impregnation of the reinforcing materials and the conversion to the B stage, but also in connection with the disposal of wastes.

Because dicyandiamide is only sparingly soluble, large amounts of solvent must be used, which influence the impregnating viscosity in such a way that the binder content on the reinforcing materials cannot be chosen at will.

Since the solvents cannot be eliminated completely during the cure, thermal loading of the components, installed in equipment, also poses the danger that in the field the solvents are discharged uncontrolled to the surrounding air.

The present invention thus has as an object to overcome these drawbacks and to provide a process for the manufacture of fiber-reinforced base materials which are used in the electrical industry, and particularly in electronics and microelectroncis, for the manufacture of printed circuit boards.

In accordance with the invention, this object is accomplished by using a curable mixture of epoxy resins and latent amine curing agents based on imidazole-acrylic acid reaction products.

Thus, one object of the invention is to provide a process for manufacturing fiber-reinforced base materials for the electrical industry by first converting reinforcing materials impregnated with binder to the B stage by the use of pressure and heat, and then curing them completely at elevated temperature, which is characterized in that the binder used consists of curable mixtures of:

(a) epoxy resins;

b) at least one of the curing agents of the general formula

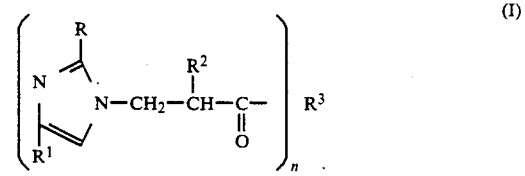

wherein

R, $R^1$ and $R^2$ are, independently of one another, H or a short-chain alkyl group having from 1 to 3 carbon atoms, $R^3$ is a group of the formula

wherein m is an integer between 2 and 6, $R^4$ is H, —OH or or —O—, and n is equal to the valence of $R^3$; and optionally (c) commonly used auxiliary and additive substances, pigments, fillers, stabilizers, and solvents.

A further object of the invention is characterized in that compounds of the general formula (I) wherein R is —$CH_2$— $CH_3$, $R^2$ is H and $R^3$ is O—$(CH_2)_2$—$R^4$, $R^4$ being H or OH, are used as curing agents according to (b).

Still another object of the invention is characterized in that the curing agents are used in amounts of from 1 to 10 g, and more particularly from 4 to 6 g, per 100 g of epoxy resin.

A further object of the invention is characterized in that glycidyl ethers based on bisphenol A, bisphenol F and novolacs with epoxy values of from 0.18 to 0.6, and more particularly from 0.39 to 0.55, are used as the epoxy resins. Commercial halogenated, and particularly chlorinated, epoxy resins based on said raw materials are preferably used.

For the manufacture of composite materials, two basic processes are employed today. One of these is the wet lay-up process in which the reinforcing materials are impregnated with the curable mixture, superimposed on one another in the wet state while being molded, and heat-cured in one step to the thermoset final state.

In the other process, the two-step process, prepregs are first produced from the reinforcing materials and the curable mixture, and these prepregs are then processed into the finished parts in a separate second step.

Because of the viscosity of the epoxy resins used, which occasionally is quite high, the fiber-reinforced base materials for circuit boards are manufactured predominantly by the two-step process since only then can the viscosity of the binder system be varied over a wide range by adding solvents.

The prepregs are usually formed in a continuous process in which the reinforcing materials are passed through an impregnating bath of the resin/curing agent mixture being used. The quantity of impregnant to be deposited on a particular base-material web is regulated through the viscosity of the impregnant and through squeegee rolls located downstream.

With solvent-containing systems, the solvent contained in the impregnating solution is evaporated through the input of heat after the impregnating operation and the resin system is converted at the same time from the A stage to the B stage. depending on the process conditions, the reinforcing materials impregnated with liquid to highly viscid impregnant are thus turned into a prepreg that is slightly tacky to almost dry. In this process step it is important that the solvent is completely eliminated from the impregnating mixture, and that the latent curing agent needed for the prepreg cure in the second process step is not yet activated, which would cause an undesired complete reaction of the impregnated reinforcing materials.

With solvent-free systems, depending on the chemical composition of the resin system there is either also a short heat treatment of the material after impregnation to convert the impregnant to the B stage or the reinforcing materials are faced on both sides with release sheets immediately after impregnation, without any heat treatment, and placed into intermediate storage appropriate to the system. During this intermediate storage, either a gradual transition of the resin system to the B stage takes place or the impregnant is fixed on the base materials through physical effects alone and largely without chemical changes.

The prepregs so obtained can be stored and shipped as rolls before they are cut to size for a particular end use and placed one on top of the other to the thickness of a board. Under the simultaneous action of pressure and heat, the prepreg stack is completely cured to give a high-strength molded part, with the still fluid low-molecular-weight resins passing into the high-molecular-weight C stage of a thermoset.

While in the one-step process long open times and short curing times at low curing temperatures are all that is required, prolonged storage stability of the prepregs is an additional requirement in the two-step process. Storage temperatures below room temperature are increasingly held to be unacceptable.

Of further importance is that depending on the procedure employed to form the prepregs the viscosity of the ready-for-use curable mixtures remain substantially constant over as long a period as possible. This is necessary, especially when a large-volume impregnating bath is used, for achieving a constant resin deposition and a constant B stage as the conditions of production cannot be continually adjusted to changing relationships within the curable mixture and as fluctuations in the viscosity have an adverse effect on the physical properties of the finished cured product.

What is desired in practice is a curable mixture whose viscosity remains constant over an extended period in the impregnating bath and which reacts at low temperatures in a short time to the B stage and can then be stored as prepregs at room temperature for long periods of time without undergoing chemical changes.

The complete cure of the prepregs which follows should occur at the lowest possible temperature within a short time, the maximum temperature of the exothermic reaction should remain at a low level even with moderately thick layers, and the profile of physical properties of the finished products should meet practical requirements.

Dicyandiamide, long used as curing agent in curable mixtures based on epoxy resins, is usually combined with co-curing agents and/or accelerators to achieve the desired properties. A great many proposals are known from the literature in this area.

However, to obtain homogeneous substrates, dicyandiamide must be used in dissolved form as otherwise crystalline unreacted particles will remain in the substrates.

But the few solvents in which dicyandiamide is soluble in sufficient amounts are physiologically hazardous and give rise to processing problems.

In contrast thereto, the curing agents used in accordance with the invention are soluble in sufficient amounts in all commonly used physiologically safe solvents, including highly volatile one. Consequently, the impregnating viscosity of the curable mixture can be adjusted to practical requirements and the solvent can be eliminated practically completely without any difficulty in the conversion to the B stage.

Solvents suitable for use in accordance with the invention are those commonly employed in this field, for example, ketones, aliphatic and aromatic hydrocarbons, and glycol ethers. Ketones such as acetone or methyl ethyl ketone, or mixtures thereof, are preferred in accordance with the invention.

The compounds of formula (I) used in accordance with the invention act both as curing agents and as accelerators, and the concurrent use of commonly used accelerators and curing agents can therefore be dispensed with.

The curing agents or accelerators, respectively, preferably used in accordance with the invention are compounds of the general formula

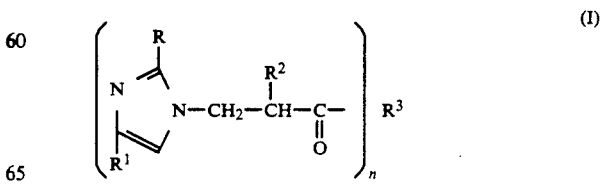

In accordance with the invention, compounds of general formula (I) are preferably used wherein R is —CH$_2$—CH$_3$, R$^1$ is CH$_3$, R$^2$ is H and R$^3$ is —O—(CH$_2$)mR$^4$, m being an integer between 2 and 4 and R$^4$ being H or —OH.

The amount of curing agents or accelerators may be varied over a wide range. It is determined by the intended end use and by the curing conditions which the latter may impose. In accordance with the invention, amounts ranging from 1 to 10, and preferably from 4 to 6, parts by weight per 100 parts by weight of epoxy compound, are used.

The nitrogenous heterocyclic amine compounds which in accordance with the invention may also be used, if desired, are compounds of the general formula

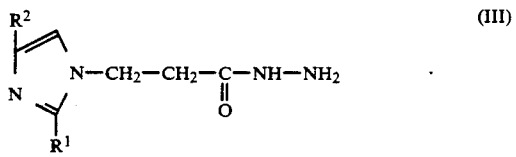 (III)

wherein R$_1$ and R$^2$ have the meaning given above, and/or compounds of the general formula

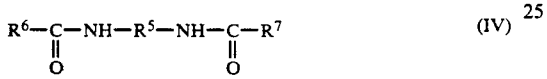 (IV)

wherein R$^5$ is an optionally substituted aliphatic, cycloaliphatic, aromatic or araliphatic groups and R$^6$ and R$^7$ may be

independently of each other, R$^1$ and R$^2$ having the meaning given above and R$^8$ and R$^9$ being, independently of each other, an optionally branched alkyl group having from 1 to 4 carbon atoms, and preferably methyl.

The epoxy resins used in accordance with the invention are glycidyl esters and ethers with two or more epoxy groups per molecule, and preferably glycidyl ethers based on mono- or polyhydric phenols. In accordance with the invention, glycidyl ethers of 2,2-bis(4-hydroxyphenol)propane (bisphenol A) with epoxy values of 0.2 to 0.6, and particularly the compounds which at room temperature are semisolid and range from highly viscous to moderately viscous and have epoxy values of about 0.39 to 0.55, are preferred. The glycidyl ethers based on bisphenol F and the novolacs have also proved advantageous.

For modification of the properties of the finished product, modifying or auxiliary substances such as phenolic resins, melamine resins or silicone resins may be used, in addition to other epoxy resins.

To obtain the desired viscosity, resins of different viscosities, diluents, commonly used solvents such as dimethylformamide, acetone, methyl ethyl ketone, methyl glycol or propylene glycol monomethyl ether, or mixtures thereof, may be used.

For prepregging, organic and inorganic fibers, nonwoven and woven fabrics, and particularly glass are used.

The solvent-containing prepregs are formed by conventional methods in which the base materials are impregnated in an impregnating bath with the reactive resin mixture and, after the excess resin has been squeegeed off, are continuously converted from the A stage to the B stage with input of energy (mostly heat) and simultaneous elimination of the solvent. Depending on the desired prepreg consistency (viscid to solid), the prepregs are then provided on both sides with a release sheet and wound into a roll for storage and shipping. The further processing consists of cutting the individual prepreg layers to size and placing them one on top of the other, and from this stack a highly crosslinked part is produced by molding with simultaneous heat input.

EXAMPLES (I) Preparation of curing agents used in accordance with the invention (1) Product of reaction of 2-ethyl-4-methylimidazole with methyl acrylate A charge of 5,500 g (50 mols) of 2-ethyl-4-methylimidazole (liquid) is heated to 50° C. At that temperature, 4,300 g (50 mols) of methyl acrylate is gradually and continuously added.

The mixture is allowed to react for approximately another 2 hours at 50° C. The reaction product so obtained has the following characteristics:
Amine value: 307-308.
Viscosity: 19 mPa·s/25° C.

Product of reaction of 2-ethyl-4-methylimidazole with butanediol acrylate 99.1 g (0.5 mol) of butanediol acrylate is reacted with 110.2 g (1.0 mol) of 2-ethyl-4-methylimidazole (liquid) as described under (1).

The reaction product so obtained has the following characteristics:
Amine value: 295-296.
Viscosity: 2,500 mPa·s/25° C.

(3) Product of reaction of 2-ethyl-4-methylimidazole with 2-hydroxyethyl acrylate 348.3 g (3 mols) of 2-hydroxyethyl acrylate is reacted with 330.6 g (3 mols) of 2-ethyl-4-methylimidazole (liquid) as described under (1).

The reaction product so obtained has the following characteristics:
Amine value: 246-247
Viscosity: 2,060 mPa·s/25° C.

(4) Product of reaction of 2-ethyl-4-methylimidazole with butanediol monoacrylate 144.2 g (1 mol) of butanediol monoacrylate is reacted with 110.2 g (1 mol) of 2-ethyl-4-methylimidazole (liquid) as described under (1).

The reaction product so obtained has the following characteristics:
Amine value: 233-232
Viscosity: 450 mPa·s/25° C.

Preparation of a prepreg reaction mixture 5 g of reaction product (I) (1) is mixed at room temperature with 100 g of a novolac-based epoxy resin with an epoxy value of 0.18 and a bromine content of 19.5% and with 45 g of methyl ethyl ketone and used for the production of prepregs.

The prepregs are produced on the laboratory scale by coating the impregnating solution onto a glass-filament fabric in a satin weave measuring about 0.1 m² (296 g/m²) which after being impregnated is heat-treated for 2 minutes in a forced-air oven at 120° C. After the evaporation of the solvent and the conversion of the resin system from the A stage to the B stage, flexible, slightly tacky prepregs are obtained which can be processed further to high-strength molded parts even after being stored for several weeks between polyethylene sheets at room temperature.

During lamination, the binder exhibits a good rheological behavior, and the finished products, cured for 60 minutes at 120° C., show no defects whatever so far as the adhesion of the individual prepreg layers to one another is concerned.

The examples listed in Table 1 were run and tested by this procedure.

TEST METHODS

The glass transition temperature ($T_g$) was determined with a TA 3000 differential scanning calorimeter (DSC), made by Mettler, with a DSC 30 measuring junction in the following manner:

About 10 to 12 mg of the reactive mixture was weighed into the cup of the DSC apparatus and cured for 30 minutes in the measuring cell, which had been preheated to 120° C.

After the cell had been cooled to 30° C., the measurement was made at a programmed temperature-increase rate of 10° C./min.

The mechanical properties were measured on molded parts 2.5 mm thick which had been cured by compressing nine prepreg layers (type 92626-J550 glass fabrics manufactured by Interglas) at 120° C. and 10 bars for 1 hour.

The following values were determined:

| Tensile strength | DIN 53455 |
|---|---|
| Elongation | DIN 53455 |
| Modulus of elasticity | DIN 53457 |
| Interlaminar shear | ISO 4585 |

TABLE 1

| Example | Curing agent Type | Quantity g | Epoxy resin 100 g | Solvent | $T_g$, °C. |
|---|---|---|---|---|---|
| A | (I) (1) | 5 | (II) | MEK 45 | 110 |
| B | (I) (2) | 5 | (II) | MEK 45 | 119 |
| C | (I) (3) | 5 | (II) | MEK 45 | 129 |
| D | (I) (4) | 5 | (II) | MEK 45 | 118 |
| E | (I) (3) | 2.5 | (II) | MEK 45 | 115 |
| F | (I) (3) | 7.5 | (II) | MEK 45 | 120 |
| G | (I) (3) F (IV) | 4.75 0.25 | (II) | MEK 45 | 124 |
| H | (I) (3) F (III) | 0.25 4.75 | (II) | MEK 45 | 130 |
| I | (I) (3) F (III) | 2.25 2.2 | (II) | MEK 45 | 131 |
| Comparative | (I) (III) | 5 | (II) (1) | MEK 45 | 115 |

TABLE 1-continued

| Example | Curing agent Type | Quantity g | Epoxy resin 100 g | Solvent | $T_g$, °C. |
|---|---|---|---|---|---|
| ative | Dicyandiam. | 8 | | | |

KEY:
MEK = Methyl ethyl ketone
F (IV) = Compound of formula (IV) where $R^6$ = (1) and $R^7$ = (2)
F (III) = Compound of formula (III)

For example C and the comparative example, the mechanical properties were also determined.

| Example | Tensile strength | Elongation | Modulus of elasticity | Interlaminar shear |
|---|---|---|---|---|
| C | 237 N/mm² | 1.5% | 17,200 N/mm² | 29 N/mm² |
| Comparative | 235 N/mm² | 1.4% | 17,500 N/mm² | 28 N/mm² |

We claim:

1. A process for manufacturing fiber-reinforced base materials for the electrical industry comprising converting reinforcing materials impregnated with binder to the B stage by the use of pressure and heat, and subsequently curing said B stage reinforcing materials completely at elevated temperature, wherein said binder comprises a curable mixture of
   (a) an epoxy resin and
   (b) at least one curing agent of formula I

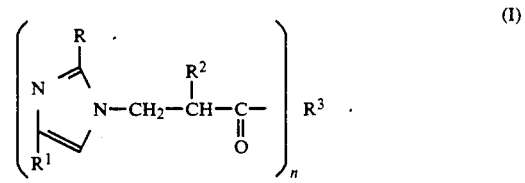

wherein R, $R^1$ and $R^2$ are, independently of one another, H or a short-chain alkyl group having from 1 to 3 carbon atoms,
$R^3$ is a group of formula II

—O—(CH₂)$_m$—R⁴    (II)

wherein m is an integer between 2 and 6, $R^4$ is H, —OH or and n is equal to the valence of $R^3$, and a curing agent of the formula III

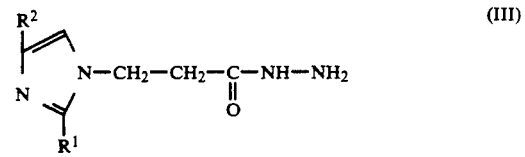

wherein $R^1$ and $R^2$ have the meanings given above.

2. A process for manufacturing fiber-reinforced base materials for the electrical industry comprising converting reinforcing materials impregnated with binder to the B stage by the use of pressure and heat, and subsequently curing said B stage reinforcing materials completely at elevated temperature, wherein said binder comprises a curable mixture of
   (a) an epoxy resin and
   (b) at least one curing agent of formula I

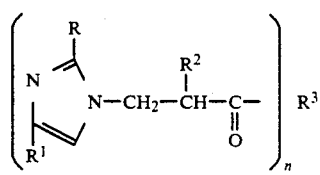 (I)

wherein R, R$^1$ and R$^2$ are, independently of one another, H or a short-chain alkyl group having from 1 to 3 carbon atoms,
R$^3$ is a group of formula II

 (II)

wherein m is an integer between 2 and 6, R$^4$ is H, —OH or —O— and n is equal to the valence of R$^3$, and a curing agent of the general formula IV

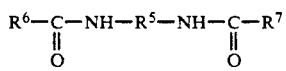 (IV)

wherein R$^5$ is an optionally substituted aliphatic, cycloaliphatic, aromatic or araliphatic group and R$^6$ and R$^7$ are

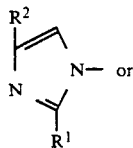 (1)

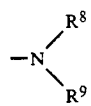 (2)

independently of one another, R$^1$ and R$^2$ having the meanings given above and R$^8$ and R$^9$ are, independently of one another, an optionally branched alkyl group having from 1 to 4 carbon atoms.

3. A process for manufacturing fiber-reinforced base materials for the electrical industry comprising converting reinforcing materials impregnated with binder to the B stage by the use of pressure and heat, and subsequently curing said B stage reinforcing materials completely at elevated temperature, wherein said binder comprises a curable mixture of
   (a) an epoxy resin and
   (b) at least one curing agent of formula I

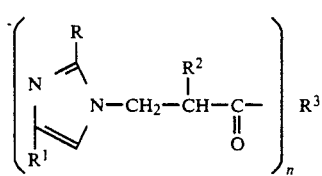 (I)

wherein R, R$^1$ and R$^2$ are, independently of one another, H or a short-chain alkyl group having from 1 to 3 carbon atoms,
R$^3$ is a group of formula II
—O—(CH$_2$)$_m$—R$^4$   (II)

wherein m is an integer between 2 and 6, R$^4$ is H, —OH or —O— and n is equal to the valence of R$^3$, and a curing agent of formula III

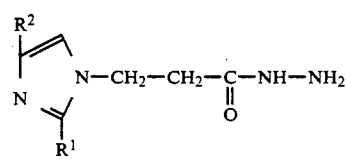 (III)

wherein R$^1$ and R$^2$ have the meanings given above, and a curing agent of formula IV

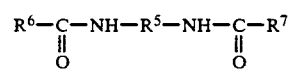 (IV)

wherein R$^5$ is an optionally substituted aliphatic, cycloaliphatic, aromatic or araliphatic group and R$^6$ and R$^7$ are

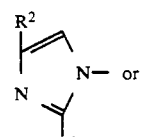 (1)

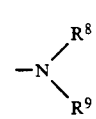 (2)

independently of one another, R$^1$ and R$^2$ having the meanings given above and R$^8$ and R$^9$ are, independently of one another, an optionally branched alkyl group having from 1 to 4 carbon atoms.

4. A process as defined in claim 3, wherein R$^8$ and R$^9$ are methyl.

5. A process as defined in claim 2, wherein, in formula IV, R$^6$ and R$^7$ are different and R$^8$ is —CH$_3$.

6. A process as defined in claim 3, wherein, in formula IV, R$^6$ and R$^7$ are different and R$^8$ is —CH$_3$.

7. A process as defined in claim 6, wherein the curing agents of the formulas III and IV are used in amounts of from 5 to 95 percent by weight, based on the curing agents of formula I.

* * * * *